(12) United States Patent
Dietrich et al.

(10) Patent No.: US 8,440,037 B2
(45) Date of Patent: *May 14, 2013

(54) COATED ARTICLE WITH LOW-E COATING INCLUDING IR REFLECTING LAYER(S) AND CORRESPONDING METHOD

(75) Inventors: Anton Dietrich, Fontnas (CH); Philip J. Lingle, Temperance, MI (US); Jens-Peter Muller, Differdange (LU); Jean-Marc Lemmer, Luxembourg (LU)

(73) Assignees: Centre Luxembourgeois de Recherches pour le Verre et la Ceramique S.A. (C.R.V.C.), Grand Duche de Luxembourg; Guardian Industries Corp., Auburn Hills, MI (US)

( * ) Notice: Subject to any disclaimer, the term of this patent is extended or adjusted under 35 U.S.C. 154(b) by 1371 days.

This patent is subject to a terminal disclaimer.

(21) Appl. No.: 11/585,227

(22) Filed: Oct. 24, 2006

(65) Prior Publication Data
US 2007/0036990 A1 Feb. 15, 2007

Related U.S. Application Data

(60) Division of application No. 10/797,580, filed on Mar. 11, 2004, now Pat. No. 7,879,448, which is a continuation-in-part of application No. 10/787,823, filed on Feb. 27, 2004, now Pat. No. 7,462,398, and a continuation-in-part of application No. 10/453,790, filed on Jun. 4, 2003, now Pat. No. 8,173,263, which is a division of application No. 09/794,224, filed on Feb. 28, 2001, now Pat. No. 6,576,349, and a division of application No. 10/337,383, filed on Jan. 7, 2003, now Pat. No. 6,723,211, and a division of application No. 10/337,384, filed on Jan. 7, 2003, now Pat. No. 6,686,050.

(60) Provisional application No. 60/217,101, filed on Jul. 10, 2000.

(51) Int. Cl.
*B32B 17/00* (2006.01)
*B32B 17/06* (2006.01)

(52) U.S. Cl.
USPC ... 156/99; 156/109; 427/255.11; 427/255.18; 427/255.27; 427/452; 427/453; 427/567; 427/574; 427/578

(58) Field of Classification Search .......... 427/452, 427/567, 574, 578, 579, 255.11, 255.18, 427/255.27; 156/99–109
See application file for complete search history.

(56) References Cited

U.S. PATENT DOCUMENTS 4,098,956 A * 7/1978 Blickensderfer et al. ..... 428/627
4,806,220 A 2/1989 Finley
(Continued)

FOREIGN PATENT DOCUMENTS

DE 42 11 363 10/1993
EP 1 174 397 1/2002
(Continued)

OTHER PUBLICATIONS

Supplementary European Search Report dated Apr. 24, 2007.
(Continued)

*Primary Examiner* — Christopher Schatz
(74) *Attorney, Agent, or Firm* — Nixon & Vanderhye P.C.

(57) ABSTRACT

A coated article is provided that may be heat treated in certain example embodiments. A coating of the coated article includes a zinc oxide inclusive layer located over and contacting a contact layer that is in contact with an infrared (IR) reflecting layer of a material such as silver. It has been found that the use of such a zinc oxide inclusive layer results in improved thermal stability upon heat treatment, increased visible transmission, and/or lower sheet resistance ($R_s$).

8 Claims, 2 Drawing Sheets

U.S. PATENT DOCUMENTS

| | | | |
|---|---|---|---|
| 4,898,789 A | 2/1990 | Finley | |
| 5,110,662 A | 5/1992 | Depauw et al. | |
| 5,153,054 A | 10/1992 | Depauw et al. | |
| 5,201,926 A | 4/1993 | Szczyrbowski et al. | |
| 5,270,517 A | 12/1993 | Finley | |
| 5,344,718 A | 9/1994 | Hartig et al. | |
| 5,552,180 A | 9/1996 | Finley et al. | |
| 5,557,462 A | 9/1996 | Hartig et al. | |
| 5,584,902 A | 12/1996 | Hartig et al. | |
| 5,688,585 A | 11/1997 | Lingle et al. | |
| 5,718,980 A | 2/1998 | Koch et al. | |
| 5,770,321 A | 6/1998 | Hartig et al. | |
| 5,800,933 A | 9/1998 | Hartig et al. | |
| 5,821,001 A | 10/1998 | Arbab et al. | |
| 5,837,361 A | 11/1998 | Glaser et al. | |
| 5,942,338 A | 8/1999 | Arbab et al. | |
| 5,948,538 A | 9/1999 | Brochot et al. | |
| 6,042,934 A | 3/2000 | Guiselin et al. | |
| 6,090,481 A | 7/2000 | Depauw et al. | |
| 6,114,043 A * | 9/2000 | Joret | 428/428 |
| 6,287,675 B1 | 9/2001 | Guiselin et al. | |
| 6,316,110 B1 | 11/2001 | Anzaki et al. | |
| 6,322,881 B1 | 11/2001 | Boire et al. | |
| 6,336,999 B1 | 1/2002 | Lemmer et al. | |
| 6,340,529 B1 | 1/2002 | Ebisawa et al. | |
| 6,398,925 B1 | 6/2002 | Arbab et al. | |
| 6,445,503 B1 | 9/2002 | Lingle | |
| 6,472,636 B1 | 10/2002 | Baldwin | |
| 6,492,619 B1 | 12/2002 | Sol | |
| 6,514,620 B1 | 2/2003 | Lingle et al. | |
| 6,524,688 B1 | 2/2003 | Eby et al. | |
| 6,524,714 B1 | 2/2003 | Neuman et al. | |
| 6,541,084 B2 | 4/2003 | Wang | |
| 6,572,940 B1 | 6/2003 | Noethe et al. | |
| 6,576,349 B2 | 6/2003 | Lingle et al. | |
| 6,582,809 B2 | 6/2003 | Boire et al. | |
| 6,589,658 B1 | 7/2003 | Stachowiak | |
| 6,602,608 B2 | 8/2003 | Stachowiak | |
| 6,605,358 B1 | 8/2003 | Stachowiak | |
| 6,625,875 B2 | 9/2003 | Sol | |
| 6,632,491 B1 | 10/2003 | Thomsen et al. | |
| 6,686,050 B2 | 2/2004 | Lingle et al. | |
| 6,723,211 B2 | 4/2004 | Lingle et al. | |
| 6,787,005 B2 * | 9/2004 | Laird et al. | 204/192.27 |
| 2002/0064662 A1 | 5/2002 | Lingle et al. | |
| 2003/0049464 A1 | 3/2003 | Glenn et al. | |
| 2003/0150711 A1 | 8/2003 | Laird | |
| 2003/0180547 A1 * | 9/2003 | Buhay et al. | 428/434 |
| 2004/0005467 A1 | 1/2004 | Neuman et al. | |
| 2004/0043226 A1 | 3/2004 | Laird et al. | |

FOREIGN PATENT DOCUMENTS

| | | |
|---|---|---|
| EP | 1 238 950 | 9/2002 |
| EP | 1 329 307 | 7/2003 |

OTHER PUBLICATIONS

U.S. Appl. No. 10/797,580, filed Mar. 11, 2004.
U.S. Appl. No. 10/787,823, filed Feb. 27, 2004.
U.S. Appl. No. 10/453,790, filed Jun. 4, 2003.
Provisional U.S. Appl. No. 60/217,101, filed Jul. 10, 2000.
Dictionary definition of "stainless steel", The American Heritage Dictionary of the English Language, 4$^{th}$ Edition Copyright 2004, 2000 by Houghton Mifflin Company. (no month).

* cited by examiner

COATED ARTICLE WITH LOW-E COATING INCLUDING IR REFLECTING LAYER(S) AND CORRESPONDING METHOD

This application is a divisional of Ser. No. 10/797,580, filed Mar. 11, 2004, now U.S. Pat. No. 7,879,448 which is a continuation-in-part (CIP) of U.S. Ser. No. 10/787,823, filed Feb. 27, 2004; now U.S. Pat. No. 7,462,398 and is also a CIP of U.S. Ser. No. 10/453,790, filed Jun. 4, 2003, now U.S. Pat. No. 8,173,263 which is a divisional of each of (a) Ser. No. 09/794,224, filed Feb. 28, 2001 (U.S. Pat. No. 6,576,349); (b) Ser. No. 10/337,383, filed Jan. 7, 2003, (U.S. Pat. No. 6,723,211); and (c) Ser. No. 10/337,384, filed Jan. 7, 2003, (U.S. Pat. No. 6,686,050), which claim priority on U.S. Provisional Patent Application No. 60/217,101, filed Jul. 10, 2000, the entire disclosures of which are all hereby incorporated herein by reference in this application.

This invention relates to a coated article including a low-E coating. In certain example embodiments, a layer comprising zinc oxide may be located over an infrared (IR) reflecting layer. In certain example embodiments, a layer comprising zinc oxide may be provided as a contact layer directly under an IR reflecting layer. In certain example embodiments, the coated article may be heat treated (e.g., thermally tempered, heat bent and/or heat strengthened). Coated articles according to certain example embodiments of this invention may be used in the context of vehicle windshields, insulating glass (IG) window units, other types of windows, or in any other suitable application.

BACKGROUND OF THE INVENTION

Coated articles are known in the art for use in window application such as insulating glass (IG) window units, vehicle windows, and/or the like. It is known that in certain instances, it is desirable to heat treat (e.g., thermally temper, heat bend and/or heat strengthen) such coated articles for purposes of tempering, bending, or the like in certain example instances.

In certain situations, designers of coated articles often strive for a combination of high visible transmission, substantially neutral color, low emissivity (or emittance), and low sheet resistance ($R_s$). High visible transmission for example may permit coated articles to be more desirable in applications such as vehicle windshields or the like, whereas low-emissivity (low-E) and low sheet resistance characteristics permit such coated articles to block significant amounts of IR radiation so as to reduce for example undesirable heating of vehicle or building interiors.

However, heat treatment of coated articles typically requires use of temperature(s) of at least 580 degrees C., more preferably of at least about 600 degrees C. and still more preferably of at least 620 degrees C. The use of such high temperatures (e.g., for 5-10 minutes or more) often causes coatings to break down and/or causes one or more of the aforesaid desirable characteristics to significantly deteriorate in an undesirable manner. Those in the art strive for heat treatability in certain applications, coupled with acceptable optical and solar characteristics.

U.S. Pat. No. 6,686,050 (see also US 2002/0064662 A1) discloses, inter alia, a heat treatable coated article with the below-listed layer stack where the layers are listed in order from the glass substrate outwardly.

| Glass Substrate |
| --- |
| $TiO_2$ |
| $Si_3N_4$ |
| $NiCrO_x$ |
| Ag |
| $NiCrO_x$ |
| $SnO_2$ |
| $Si_3N_4$ |
| $NiCrO_x$ |
| Ag |
| $NiCrO_x$ |
| $SnO_2$ |
| $Si_3N_4$ |

As evidenced by Examples 1-3 of U.S. Pat. No. 6,686,050, following heat treatment the resulting coated article had sheet resistance ($R_s$) of about 3.3 to 3.5 ohms/square, and following lamination had a visible transmission of about 75%. There is certainly room for improvement in one or both of these respects. For example, it would be desirable if: (a) visible transmission could be increased following lamination so as to improve optical characteristics, and/or (b) sheet resistance lowered before and/or after heat treatment (HT) so as to improve solar characteristics.

In view of the above, it will be apparent to those skilled in the art that there exists a need for coated articles which are capable of providing high visible transmission, substantially neutral color, low emissivity (or emittance), and/or low sheet resistance ($R_s$). In certain example embodiments, it may be desired that one or all of these characteristics can be achieved even after the coated article has been heat treated and/or laminated.

BRIEF SUMMARY OF EXAMPLE EMBODIMENTS OF THE INVENTION

In certain example embodiments of this invention, a layer comprising zinc oxide is provided over a contact layer that is in contact with an infrared (IR) reflecting layer of a material such as silver. Unexpectedly, it has been found that the use of such a zinc oxide inclusive layer results in higher visible transmission and thus improved optical characteristics, lower sheet resistance ($R_s$) (and lower emittance) and thus improved solar characteristics, and/or improved thermal stability upon heat treatment (HT).

Surprisingly, it has been found that the provision of the zinc oxide inclusive layer directly over and contacting for example a nickel chrome oxide inclusive layer above a silver IR reflecting layer provides for unexpected results. In particular, by using zinc oxide in this layer (as opposed to solely tin oxide for example), the resulting coated article upon heat treatment (HT) unexpectedly has, for example, one or more of: higher visible transmission, improved thermal stability upon heat treatment, lower sheet resistance ($R_s$), and lower emissivity (e.g., hemispherical emissivity). These surprisingly results, which in certain example instances associated with the use of the combination layer stack portion of glass ... $ZnO/Ag/NiCrO_x/ZnO$ ..., are highly advantageous, since lower emissivity, lower sheet resistance, higher visible transmission and/or improved thermal stability are desired features in coated articles.

In certain example embodiments of this invention, coated articles have been provided which are capable of realizing high visible transmission and/or low sheet resistance characteristics.

In certain example embodiments of this invention, there is provided a coated article comprising a coating supported by a glass substrate, the coating comprising: a first dielectric layer; a first infrared (IR) reflecting layer comprising silver located over at least the first dielectric layer; a first layer comprising zinc oxide located over at least the first IR reflecting layer and the first dielectric layer; a second IR reflecting layer comprising silver located over and contacting the first layer comprising zinc oxide; a layer comprising an oxide of NiCr located over and contacting the second IR reflecting layer; a second layer comprising zinc oxide located over and contacting the layer comprising the oxide of NiCr; and another dielectric layer located over at least the second layer comprising zinc oxide.

In certain other example embodiments of this invention, there is provided a coated article comprising a coating supported by a glass substrate, the coating comprising: a first dielectric layer; a first infrared (IR) reflecting layer comprising silver located over at least the first dielectric layer; a second dielectric layer located over at least the first IR reflecting layer; a second IR reflecting layer comprising silver located over at least the second dielectric layer and the first IR reflecting layer; a layer comprising an oxide of Ni and/or Cr located over and contacting the second IR reflecting layer; a layer comprising zinc oxide located over and contacting the layer comprising the oxide of Ni and/or Cr; and another dielectric layer located over at least the layer comprising zinc oxide.

DETAILED DESCRIPTION OF EXAMPLES OF THE INVENTION

Figure 1:
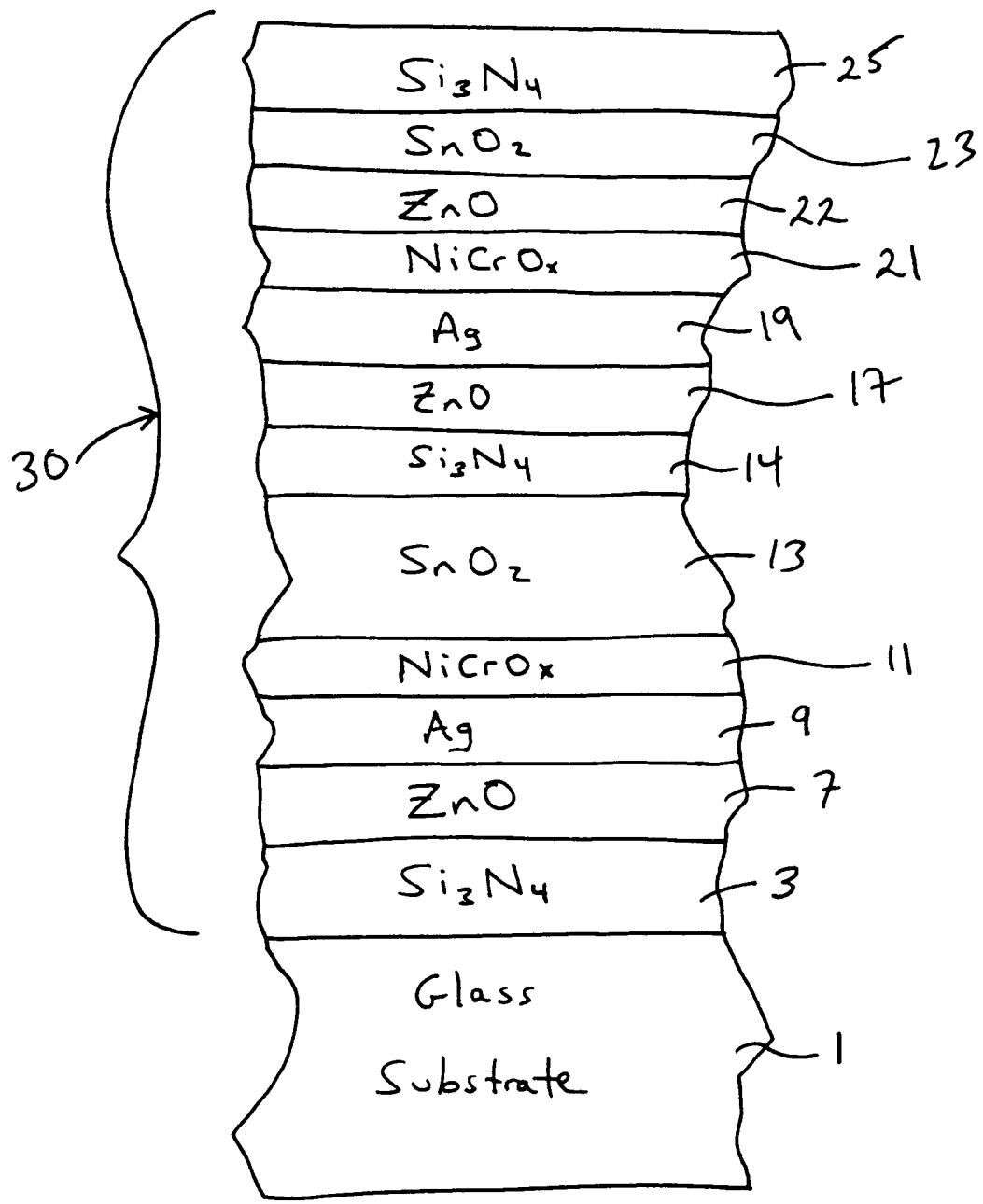
FIG. 1 is a cross sectional view of a coated article according to an example embodiment of this invention.

Coated articles herein may be used in applications such as vehicle windshields, monolithic windows, IG window units, and/or any other suitable application that includes single or multiple glass substrates. In vehicle windshield applications, for example, a pair of glass substrates may be laminated together with a polymer based layer such as PVB, and the coating is provided on the interior surface of one of the glass substrates adjacent the polymer based layer.

In certain example embodiments of this invention, there is provided a coated article comprising the following layers from the glass substrate outwardly: glass . . . ZnO/Ag/NiCrO$_x$/ZnO/SnO$_2$/Si$_x$N$_y$. Other layers and/or other materials may also be utilized in certain example embodiments of this invention. For example, and without limitation, the tin oxide (e.g., SnO$_2$) layer may be removed above the zinc oxide in certain instances. In certain example embodiments of this invention, the coating includes a double-silver stack, although this invention is not so limited in all instances.

Surprisingly, it has been found that the provision of the zinc oxide inclusive layer directly over the nickel chrome oxide inclusive contact layer above a silver infrared (IR) reflecting layer provides for unexpected results. In particular, by using zinc oxide in this layer (as opposed to solely tin oxide for example), the resulting coated article when heat treated unexpectedly has, for example: higher visible transmission, improved thermal stability, lower sheet resistance ($R_s$), and lower emissivity (e.g., hemispherical emissivity). These surprising results associated with the use of the combination layer stack portion of glass . . . ZnO/Ag/NiCrO$_x$/ZnO . . . are highly advantageous and represent a significant improvement in the art, since lower emissivity, lower sheet resistance, higher visible transmission, and/or thermal stability are desired features in coated articles.

For example, in certain example embodiments of this invention, heat treated coated articles having multiple IR reflecting layers (e.g., two spaced apart silver based layers) are capable of realizing a sheet resistance ($R_s$) of less than or equal to 3.0 (more preferably less than or equal to 2.5, even more preferably less than or equal to 2.1, and most preferably less than or equal to 2.0). In certain example embodiments, following heat treatment and as measured in monolithic form, coated articles herein are capable of realizing a visible transmission (Ill. C, 2 degree) of at least 79%, more preferably of at least 80%, and most preferably of at least 81%. Moreover, in certain example embodiments, following heat treatment and lamination, coated articles herein are capable of realizing a visible transmission (Ill. D65, 10 degree) of at least 76%, more preferably of at least 77%, even more preferably of at least 77.5%, and in certain embodiments of at least 78%.

The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes.

FIG. 1 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and coating (or layer system) 30 provided on the substrate 1 either directly or indirectly. The coating (or layer system) 30 includes: dielectric silicon nitride layer 3 which may be Si$_3$N$_4$, of the Si-rich type for haze reduction, or of any other suitable stoichiometry in different embodiments of this invention, first lower contact layer 7 (which contacts IR reflecting layer 9), first conductive and preferably metallic infrared (IR) reflecting layer 9, first upper contact layer 11 (which contacts layer 9), dielectric layer 13 (which may be deposited in one or multiple steps in different embodiments of this invention), another silicon nitride layer 14, second lower contact layer 17 (which contacts IR reflecting layer 19), second conductive and preferably metallic IR reflecting layer 19, second upper contact layer 21 (which contacts layer 19), zinc oxide inclusive layer 22, dielectric layer 23, and finally protective dielectric layer 25. The "contact" layers 7, 11, 17 and 21 each contact at least one IR reflecting layer (e.g., layer based on Ag). The aforesaid layers 3-25 make up low-E (i.e., low emissivity) coating 30 which is provided on glass or plastic substrate 1.

In monolithic instances, the coated article includes only one glass substrate 1 as illustrated in FIG. 1. However, monolithic coated articles herein may be used in devices such as laminated vehicle windshields, IG window units, and the like. A laminated vehicle window such as a windshield typically includes first and second glass substrates laminated to one another via a polymer based interlayer (e.g., see U.S. Pat. No. 6,686,050, the disclosure of which is incorporated herein by reference). One of these substrates of the laminate may support coating 30 on an interior surface thereof in certain example embodiments. As for IG window units, an IG window unit may include two spaced apart substrates. An example IG window unit is illustrated and described, for example, in U.S. Pat. No. 6,632,491, the disclosure of which is hereby incorporated herein by reference. An example IG window unit may include, for example, the coated glass substrate 1 shown in FIG. 1 coupled to another glass substrate via spacer(s), sealant(s) or the like with a gap being defined therebetween. This gap between the substrates in IG unit embodiments may in certain instances be filled with a gas such as argon (Ar). An example IG unit may comprise a pair of spaced apart clear glass substrates each about 4 mm thick one of which is coated with a coating herein in certain example instances, where the gap between the substrates may be from about 5 to 30 mm, more preferably from about 10 to 20 mm, and most preferably about 16 mm. In certain example instances, the coating 30 may be provided on the interior surface of either substrate facing the gap.

Dielectric layers 3 and 14 may be of or include silicon nitride in certain embodiments of this invention. Silicon nitride layers 3 and 14 may, among other things, improve heat-treatability of the coated articles, e.g., such as thermal tempering or the like. The silicon nitride of layers 3 and/or 14 may be of the stoichiometric type ($Si_3N_4$) type, or alternatively of the Si-rich type in different embodiments of this invention. For example, Si-rich silicon nitride 3 (and/or 14) combined with zinc oxide inclusive layer 7 (and/or 17) under a silver based IR reflecting layer 9 (and/or 19) may permit the silver to be deposited (e.g., via sputtering or the like) in a manner which causes its sheet resistance to be lessened compared to if certain other material(s) were under the silver. Moreover, the presence of free Si in a Si-rich silicon nitride inclusive layer 3 may allow certain atoms such as sodium (Na) which migrate outwardly from the glass 1 during HT to be more efficiently stopped by the Si-rich silicon nitride inclusive layer before they can reach the silver and damage the same. Thus, it is believed that the oxidation caused by heat treatment allows visible transmission to increase, and that the Si-rich $Si_xN_y$ in layer 3 can reduce the amount of damage done to the silver layer(s) during HT in certain example embodiments of this invention thereby allowing sheet resistance ($R_s$) to decrease in a satisfactory manner.

In certain example embodiments, when Si-rich silicon nitride us used in layer 3 and/or 14, the Si-rich silicon nitride layer as deposited may be characterized by $Si_xN_y$ layer(s), where x/y may be from 0.76 to 1.5, more preferably from 0.8 to 1.4, still more preferably from 0.85 to 1.2. Moreover, in certain example embodiments, before and/or after HT the Si-rich $Si_xN_y$ layer(s) may have an index of refraction "n" of at least 2.05, more preferably of at least 2.07, and sometimes at least 2.10 (e.g., 632 nm) (note: stoichiometric $Si_3N_4$ which may also be used has an index "n" of 2.02-2.04). In certain example embodiments, it has surprisingly been found that improved thermal stability is especially realizable when the Si-rich $Si_xN_y$ layer(s) as deposited has an index of refraction "n" of at least 2.10, more preferably of at least 2.20, and most preferably from 2.2 to 2.4. Also, the Si-rich $Si_xN_y$ layer in certain example embodiments may have an extinction coefficient "k" of at least 0.001, more preferably of at least 0.003 (note: stoichiometric $Si_3N_4$ has an extinction coefficient "k" of effectively 0). Again, in certain example embodiments, it has surprisingly been found that improved thermal stability can be realized when "k" for the Si-rich $Si_xN_y$ layer is from 0.001 to 0.05 as deposited (550 nm). It is noted that n and k tend to drop due to heat treatment.

Any and/or all of the silicon nitride layers discussed herein may be doped with other materials such as stainless steel or aluminum in certain example embodiments of this invention. For example, any and/or all silicon nitride layers discussed herein may optionally include from about 0-15% aluminum, more preferably from about 1 to 10% aluminum, in certain example embodiments of this invention. The silicon nitride may be deposited by sputtering a target of Si or SiAl in certain embodiments of this invention.

Infrared (IR) reflecting layers 9 and 19 are preferably substantially or entirely metallic and/or conductive, and may comprise or consist essentially of silver (Ag), gold, or any other suitable IR reflecting material. IR reflecting layers 9 and 19 help allow the coating to have low-E and/or good solar control characteristics. The IR reflecting layers may, however, be slightly oxidized in certain embodiments of this invention.

The upper contact layers 11 and 21 may be of or include nickel (Ni) oxide, chromium/chrome (Cr) oxide, or a nickel alloy oxide such as nickel chrome oxide ($NiCrO_x$), or other suitable material(s), in certain example embodiments of this invention. The use of, for example, $NiCrO_x$ in these layers (11 and/or 21) allows durability to be improved. The $NiCrO_x$ of layers 11 and/or 21 may be fully oxidized in certain embodiments of this invention (i.e., fully stoichiometric), or alternatively may only be partially oxidized. In certain instances, the $NiCrO_x$ layers 11 and/or 21 may be at least about 50% oxidized. Contact layers 11 and/or 21 (e.g., of or including an oxide of Ni and/or Cr) may or may not be oxidation graded in different embodiments of this invention. Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layers 11 and/or 21 (e.g., of or including an oxide of Ni and/or Cr) may or may not be continuous in different embodiments of this invention across the entire IR reflecting layer.

Dielectric layer 13 may be of or include tin oxide in certain example embodiments of this invention. However, as with other layers herein, other materials may be used in different instances.

Layer 22 and lower contact layers 7 and/or 17 in certain embodiments of this invention are of or include zinc oxide (e.g., ZnO). The zinc oxide of layer(s) 7, 17 and 22 may contain other materials as well such as Al (e.g., to form $ZnAlO_x$). For example, in certain example embodiments of this invention, one or more of zinc oxide layers 7, 17 and 22 may be doped with from about 1 to 10% Al, more preferably from about 1 to 5% Al, and most preferably about 2 to 4% Al. The use of zinc oxide 7, 17 under the silver 9, 19 allows for an excellent quality of silver to be achieved.

Surprisingly, it has been found that the provision of zinc oxide inclusive layer 22 directly over the nickel chrome oxide contact layer 21 above the top silver infrared (IR) reflecting layer 19 provides for unexpected results. In particular, by using zinc oxide in this layer 22 (as opposed to solely tin oxide for example), the resulting coated article when heat treated unexpectedly has, for example: improved visible transmission, improved thermal stability, lower sheet resistance ($R_s$), and lower emissivity (e.g., hemispherical emissivity). These surprising results associated with the use of the combination layer stack portion of glass . . . ZnO/Ag/$NiCrO_x$/ZnO . . . are highly advantageous and represent a significant improvement in the art, since higher visible transmission, lower emissivity, lower sheet resistance, and thermal stability are desired features in coated articles—especially articles to be heat treated. Thus, in certain example embodiments of this invention, coated articles may be taken to higher temperatures during heat treatment and/or for longer times without suffering undesirable significant transmission drops and/or increases in sheet resistance.

While the reasons for these unexpected results associated with the use of zinc oxide in layer 22 are not entirely clear, it is believed that the use of the zinc oxide in layer 22 for some reason causes the silver of IR reflecting layer 19 to be more dense and have a more preferred orientation before and/or after heat treatment (HT). It is very surprising that this is the case, especially since a contact layer 21 (e.g., $NiCrO_x$) is provided between the zinc oxide layer 22 and the silver layer 19. Because the zinc oxide in layer 22 causes the silver in layer 19 to be more dense and/or have a more preferred orientation, the silver in layer 19 and thus the overall coating is better able to withstand heat treatment at high temperatures so that a heat treated coated article with lower sheet resistance and emissivity is obtainable. Moreover, it is also surprising that the use of zinc oxide in layer 22 (as opposed to only tin oxide for example) causes the coated article to have higher visible transmission following heat treatment and lamination.

Dielectric layer 23 may be of or include tin oxide in certain example embodiments of this invention. However, layer 23 is optional and need not be provided in certain example embodiments of this invention. Dielectric layer 25, which may be an overcoat in certain example instances, may be of or include silicon nitride (e.g., $Si_3N_4$) or any other suitable material in certain example embodiments of this invention. Optionally, other layers may be provided above layer 25. Layer 25 is provided for durability purposes, and to protect the underlying layers during heat treatment and/or environmental use. In certain example embodiments, layer 25 may have an index of refraction (n) of from about 1.9 to 2.2, more preferably from about 1.95 to 2.05.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses and materials may be used in layers in different embodiments of this invention, example thicknesses and materials for the respective layers on the glass substrate 1 in the FIG. 1 embodiment are as follows, from the glass substrate outwardly:

| Example Materials/Thicknesses; FIG. 1 Embodiment | | | |
| --- | --- | --- | --- |
| Layer | Preferred Range (Å) | More Preferred (Å) | Example (Å) |
| Glass (1–10 mm thick) | | | |
| $Si_xN_y$ (layer 3) | 40–450 Å | 100–300 Å | 210 Å |
| $ZnO_x$ (layer 7) | 10–300 Å | 40–150 Å | 100 Å |

| Example Materials/Thicknesses; FIG. 1 Embodiment | | | |
| --- | --- | --- | --- |
| Layer | Preferred Range (Å) | More Preferred (Å) | Example (Å) |
| Ag (layer 9) | 50–250 Å | 80–120 Å | 98 Å |
| $NiCrO_x$ (layer 11) | 10–100 Å | 20–45 Å | 35 Å |
| $SnO_2$ (layer 13) | 0–1,000 Å | 350–800 Å | 570 Å |
| $Si_xN_y$ (layer 14) | 50–450 Å | 90–200 Å | 120 Å |
| $ZnO_x$ (layer 17) | 10–300 Å | 40–150 Å | 95 Å |
| Ag (layer 19) | 50–250 Å | 80–220 Å | 96 Å |
| $NiCrO_x$ (layer 21) | 10–100 Å | 20–45 Å | 35 Å |
| $ZnO_x$ (layer 22) | 10–300 Å | 40–150 Å | 100 Å |
| $SnO_2$ (layer 23) | 0–750 Å | 40–200 Å | 100 Å |
| $Si_3N_4$ (layer 25) | 0–750 Å | 100–320 Å | 180 Å |

In certain example embodiments of this invention, coated articles herein may have the following optical and solar characteristics set forth in Table 2 when measured monolithically (before any optional HT). The sheet resistances ($R_s$) herein take into account all IR reflecting layers (e.g., silver layers 9, 19).

| Optical/Solar Characteristics (Monolithic; pre-HT) | | | |
| --- | --- | --- | --- |
| Characteristic | General | More Preferred | Most Preferred |
| $R_s$ (ohms/sq.): | <=4.0 | <=3.5 | <=3.0 |
| $E_n$: | <=0.07 | <=0.04 | <=0.03 |
| $T_{vis}$ (Ill. C 2°): | >=70% | >=74% | >=75% |

In certain example embodiments, coated articles herein may have the following characteristics, measured monolithically for example, after heat treatment (HT):

| Optical/Solar Characteristics (Monolithic; post-HT) | | | |
| --- | --- | --- | --- |
| Characteristic | General | More Preferred | Most Preferred |
| $R_s$ (ohms/sq.): | <=3.0 | <=2.5 | <=2.1 (or <=2.0) |
| $E_n$: | <=0.07 | <=0.04 | <=0.03 |
| $T_{vis}$ (Ill. C 2°): | >=79% | >=80% | >=81% |

Moreover, in certain example laminated embodiments of this invention, coated articles herein which have been heat treated to an extend sufficient for tempering and/or heat bending, and which have been laminated to another glass substrate, may have the following optical/solar characteristics:

| Optical/Solar Characteristics (Laminated; post-HT) | | | |
| --- | --- | --- | --- |
| Characteristic | General | More Preferred | Most Preferred |
| $R_s$ (ohms/sq.): | <=3.0 | <=2.5 | <=2.1 (or ≦2.0) |
| $E_n$: | <=0.07 | <=0.04 | <=0.03 |
| $T_{vis}$ (Ill. D65 10°): | >=76% | >=77% | >=77.5% (or ≧78%) |
| Haze: | <=0.50 | <=0.40 | <=0.45 |

Moreover, coated articles including coatings according to certain example embodiments of this invention have the following optical characteristics (e.g., when the coating(s) is provided on a clear soda lime silica glass substrate 1 from 1 to 10 mm thick) (laminated). While multiple measurements may be taken at different locations across the laminate, this data is based on the average of such points.

| Example Optical Characteristics (Laminated: post-HT) | | |
|---|---|---|
| Characteristic | General | More Preferred |
| $T_{vis}$ (or TY)(Ill. D65 10°): | >=75% | >=76% (or >=77%) |
| $a^*_t$ (Ill. D65 10°): | −6 to +1.0 | −4 to 0.0 |
| $b^*_t$ (Ill. D65 10°): | −2.0 to +8.0 | 0.0 to 4.0 |
| $L^*$ (Ill. D65 10°): | 89–95 | 90–95 |
| $T_{vis}$ (or TY)(Ill. A 2°): | >=75% | >=76% (or >=77%) |
| $R_fY$ (Ill. C, 2 deg.): | 1 to 12% | 1 to 10% |
| $a^*_f$(Ill. C, 2°): | −5.0 to +2.0 | −3.5 to +0.5 |
| $b^*_f$(Ill. C, 2°): | −14.0 to +10.0 | −10.0 to 0 |
| $L^*$ (Ill. C 2°): | 30–40 | 33–38 |
| $R_gY$ (Ill. C, 2 deg.): | 1 to 12% | 1 to 10% |
| $a^*_g$ (Ill. C, 2°): | −5.0 to +2.0 | −2 to +0.5 |
| $b^*_g$ (Ill. C, 2°): | −14.0 to +10.0 | −11.0 to 0 |
| $L^*$ (Ill. C 2°): | 30–40 | 33–38 |

Figure 2:
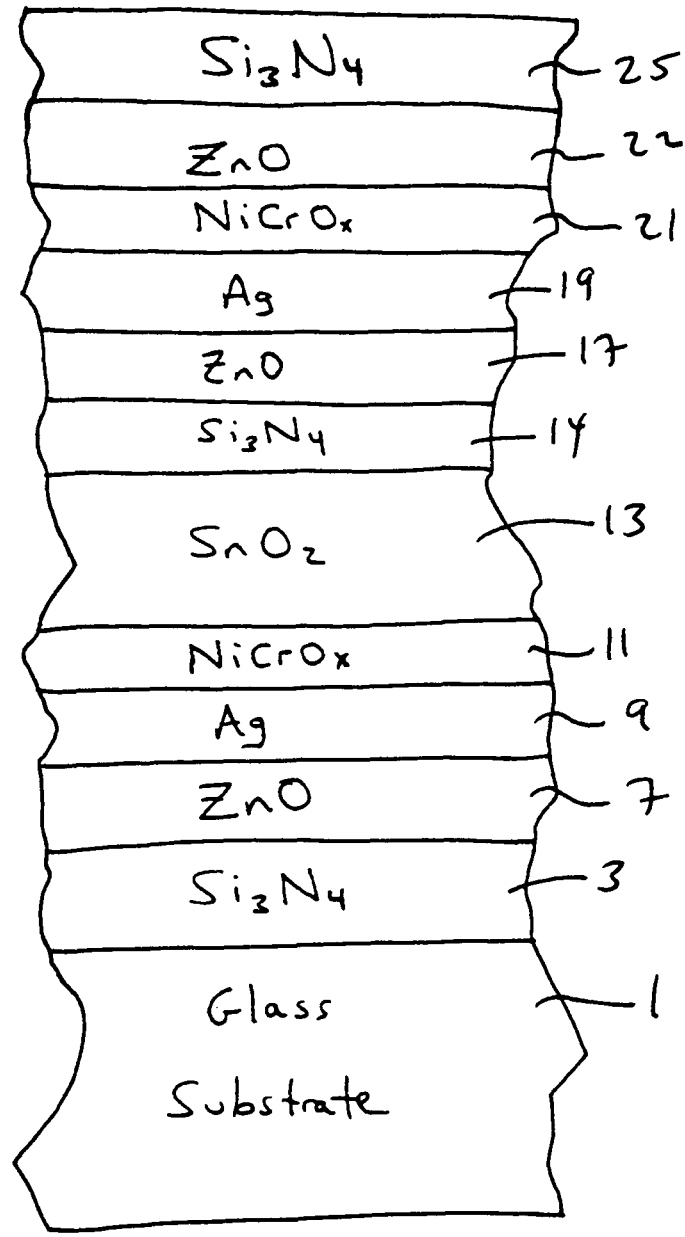
FIG. 2 is a cross sectional view of a coated article according to another example embodiment of this invention.

FIG. 2 illustrates a coated article according to another example embodiment of this invention. The FIG. 2 embodiment is similar to the FIG. 1 embodiment discussed above, except that the top tin oxide layer is not present in the FIG. 2 embodiment. Thus, zinc oxide layer 22 contacts silicon nitride overcoat 25 in the FIG. 2 embodiment.

In certain other example embodiments of this invention, it is possible to provide a layer comprising titanium oxide (e.g., $TiO_2$) between the glass substrate 1 and the silicon nitride inclusive layer 3.

The following example is provided for purposes of example only, and is not intended to be limiting unless specifically claimed.

Example

The following Example was made via sputtering on a 2.1 mm thick glass substrate so as to have approximately the layer stack set forth below and shown in FIG. 1. The thicknesses are approximations.

| Layer Stack for Example | |
|---|---|
| Layer | Thickness (Å) |
| Glass Substrate | |
| $Si_xN_y$ | 187 |
| $ZnAlO_x$ | 109 |
| Ag | 97 |
| $NiCrO_x$ | 25 |
| $SnO_2$ | 536 |
| $Si_xN_y$ | 126 |
| $ZnAlO_x$ | 115 |
| Ag | 92 |
| $NiCrO_x$ | 25 |
| $ZnAlO_x$ | 129 |
| $SnO_2$ | 127 |
| $Si_3N_4$ | 109 |

The process used in forming the coated article of the Example is set forth below. The gas flows (argon (Ar), oxygen (O), and nitrogen (N)) in the below table are in units of sccm, and include both tuning gas and gas introduced through the main. The line speed was about 5 m/min. The pressures are in units of $mbar \times 10^{-3}$. The silicon (Si) targets, and thus the silicon nitride layers, were doped with about 10% aluminum (Al). The Zn targets in a similar manner were doped with about 2% Al.

| Sputtering Process Used in Example | | | | | | | |
|---|---|---|---|---|---|---|---|
| Cathode | Target | Power(kW) | Ar | O | N | Volts | Pressure |
| C11 | Si | 51.3 | 350 | 0 | 337 | 269 | 2.39 |
| C12 | Si | 51.6 | 350 | 0 | 337 | 271 | 2.36 |
| C14 | Zn | 19.5 | 250 | 350 | 0 | 276 | 2.24 |
| C15 | Zn | 27.8 | 250 | 350 | 0 | 220 | 1.88 |
| C24 | Ag | 9.2 | 250 | 0 | 0 | 549 | 1.84 |
| C25 | NiCr | 16.5 | 350 | 190 | 0 | 514 | 2.33 |
| C28 | Sn | 27.5 | 250 | 454 | 350 | 256 | 2.30 |
| C29 | Sn | 27.4 | 250 | 505 | 350 | 247 | 1.97 |
| C39 | Sn | 31.4 | 250 | 548 | 350 | 251 | 2.35 |
| C40 | Sn | 29.2 | 250 | 458 | 350 | 245 | 2.24 |
| C41 | Sn | 32 | 250 | 468 | 350 | 268 | 2.45 |
| C43 | Si | 59.7 | 350 | 0 | 376 | 285 | 2.47 |
| C45 | Zn | 25.8 | 250 | 345 | 0 | 208 | 3.68 |
| C46 | Zn | 25.5 | 250 | 345 | 0 | 206 | 1.76 |
| C49 | Ag | 9.8 | 150 | 0 | 0 | 485 | 1.81 |
| C50 | NiCr | 16.6 | 250 | 155 | 0 | 573 | 1.81 |
| C52 | Zn | 28.5 | 250 | 325 | 0 | 209 | 1.97 |
| C53 | Zn | 29.5 | 250 | 300 | 0 | 248 | 1.36 |
| C55 | Sn | 38.2 | 250 | 563 | 350 | 278 | 2.76 |
| C59 | Si | 65 | 350 | 0 | 463 | 291 | 2.63 |

After being sputter deposited onto the glass substrate, the Example coated article was heat treated in a manner sufficient for tempering and heat bending, and following this heat treatment had the following characteristics as measured in monolithic form. This post-HT data is based on the average data of data taken from multiple points on the coated article.

Characteristics of Example (Monolithic; post-HT)
Characteristic Example
Visible Trans. ($T_{vis}$ or TY) (Ill. C 2 deg.): 81.4%
   a* −3.9
   b* 9.7
Glass Side Reflectance (RY) (Ill C, 2 deg.): 8.2%
   a* −4.7
   b* 7.2
Film Side Reflective (FY) (Ill. C, 2 deg.): 7.2%
   a* −7.7
   b* −12.9
$R_s$ (ohms/square) (pre-HT): 2.73
$R_s$ (ohms/square) (post-HT): 2.0
Haze: 0.28

The coated article of the Example was then laminated to another bent glass substrate to form a vehicle windshield product. Following the lamination, the resulting coated article laminate had the following characteristics.

Characteristics of Example (Laminated; post-HT)
Characteristic Example
Visible Trans. ($T_{vis}$ or TY) (Ill. D65 10°): 78.2%
   a* −3.1
   b* 3.7
Glass Side Reflectance (RY) (Ill C, 2 deg.): 9.3%
   a* −0.6
   b* −9.5
Film Side Reflective (FY) (Ill. C, 2 deg.): 9.3%
   a* −1.8
   b* −8.3
$R_s$ (ohms/square): see above
Haze: 0.44

It can be seen by comparing the Example above to Examples 1-3 in U.S. Pat. No. 6,686,050 that the Example above achieves significantly higher visible transmission and significantly lower sheet resistance than do the articles of the Examples in the '050 patent. Thus, the unexpected results associated with the instant invention are evidenced. For example, it can be seen that the use of the zinc oxide in layer 22 (compared to the tin oxide in the Examples in the '050 patent) unexpectedly results in improved sheet resistance and improved visible transmission.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a heat treated coated article comprising a coating supported by a glass substrate, the method comprising:

sputter-depositing a first dielectric layer comprising silicon nitride over at least the glass substrate;

sputter-depositing a first layer comprising zinc oxide over at least the layer comprising silicon nitride, the first layer comprising zinc oxide thickness from 40-150 Å;

sputter-depositing a first infrared (IR) reflecting layer comprising silver over and contacting the first layer comprising zinc oxide;

sputter-depositing a second dielectric layer comprising silicon nitride on the glass substrate over at least the first IR reflecting layer;

sputter-depositing a second layer comprising zinc oxide over at least the first IR reflecting layer and the first and second dielectric layers comprising silicon nitride, the second layer comprising zinc oxide having a thickness of from 40-150 Å;

sputter-depositing a second IR reflecting layer comprising silver over and contacting the second layer comprising zinc oxide;

sputter-depositing a layer comprising an oxide of NiCr over and contacting the second IR reflecting layer by sputtering a target comprising NiCr in an atmosphere comprising at least argon gas and a significant amount of oxygen gas, so that the layer comprising the oxide of NiCr is an oxide as it is sputter-deposited on the substrate;

sputter-depositing a third layer comprising zinc oxide over and contacting the layer comprising the oxide of NiCr;

depositing another dielectric layer located over at least the third layer comprising zinc oxide;

wherein, following said depositing steps, the layer comprising the oxide of NiCr is fully oxidized; and heat treating the coated article after the aforesaid layers have been deposited on the glass substrate, so that when measured monolithically following heat treatment the coated article has a visible transmission of at least 80%, a sheet resistance ($R_s$) of less than or equal to 2.5 ohms/square, and a normal emissivity (E) of less than or equal to about 0.04.

2. The method of claim 1, wherein at least one of the first and second layers comprising zinc oxide further comprises aluminum.

3. The method of claim 1, wherein each of the first, second and third layers comprising zinc oxide further comprise aluminum.

4. The method of claim 1, further comprising depositing a layer comprising tin oxide so as to be located between the first IR reflecting layer and the second layer comprising zinc oxide.

5. The method of claim 1, further comprising depositing a layer comprising tin oxide so as to be located between the third layer comprising zinc oxide and said another dielectric layer, wherein said another dielectric layer comprises silicon nitride, and wherein the layer comprising tin oxide contacts the third layer comprising zinc oxide and the another dielectric layer comprising silicon nitride.

6. The method of claim 1, wherein the first dielectric layer comprises silicon nitride which is Si-rich so as to be represented by $Si_xN_y$, where x/y is from 0.8 to 1.4.

7. The method of claim 1, wherein when measured monolithically following heat treatment the coated article has a visible transmission of at least 81% and a sheet resistance ($R_s$) of less than or equal to 2.1 ohms/square.

8. The method of claim 1, further comprising laminating the glass substrate with the layers thereon to another substrate to form a laminate, the laminate having a visible transmission of at least 76% and a sheet resistance ($R_s$) of less than or equal to 3.0 ohms/square.

* * * * *